(12) United States Patent
Hayashi

(10) Patent No.: US 10,921,581 B2
(45) Date of Patent: Feb. 16, 2021

(54) SCAN DRIVING DEVICE, OPTICAL SCAN CONTROL APPARATUS, AND DRIVING WAVEFORM GENERATION METHOD

(71) Applicant: Yugo Hayashi, Tokyo (JP)

(72) Inventor: Yugo Hayashi, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 149 days.

(21) Appl. No.: 16/366,170

(22) Filed: Mar. 27, 2019

(65) Prior Publication Data

US 2019/0324264 A1    Oct. 24, 2019

(30) Foreign Application Priority Data

Apr. 18, 2018    (JP) ............................. JP2018-080207

(51) Int. Cl.
| | | |
|---|---|---|
| *G02B 26/08* | (2006.01) | |
| *G02B 26/10* | (2006.01) | |
| *H03K 4/08* | (2006.01) | |
| *H02N 2/00* | (2006.01) | |
| *H03H 17/06* | (2006.01) | |

(52) U.S. Cl.
CPC ......... *G02B 26/0858* (2013.01); *G02B 26/10* (2013.01); *H03K 4/08* (2013.01); *H02N 2/0075* (2013.01); *H03H 17/06* (2013.01)

(58) Field of Classification Search
CPC ........ H03K 4/08; H02N 2/0075; H03H 17/06; G02B 26/0858; G02B 26/08; G02B 26/10
USPC ...................................................... 359/199.4
See application file for complete search history.

(56) References Cited

U.S. PATENT DOCUMENTS

| | | | | |
|---|---|---|---|---|
| 6,803,561 | B2* | 10/2004 | Dunfield | G02B 26/101 |
| | | | | 250/235 |
| 8,941,905 | B2* | 1/2015 | Aimono | G02B 26/105 |
| | | | | 359/199.4 |
| 9,291,817 | B2* | 3/2016 | Hashiguchi | G02B 26/105 |
| 10,118,533 | B2* | 11/2018 | Yatsuda | B60Q 1/0023 |
| 2003/0122066 | A1* | 7/2003 | Dunfield | G02B 26/105 |
| | | | | 250/235 |
| 2008/0239252 | A1* | 10/2008 | Konno | G02B 27/0025 |
| | | | | 353/98 |
| 2012/0242191 | A1 | 9/2012 | Aimono | |
| 2013/0258432 | A1* | 10/2013 | Aimono | G02B 26/0858 |
| | | | | 359/200.8 |
| 2015/0077823 | A1* | 3/2015 | Hashiguchi | G02B 26/0858 |
| | | | | 359/200.8 |
| 2017/0057399 | A1* | 3/2017 | Yatsuda | B60Q 1/0076 |

FOREIGN PATENT DOCUMENTS

JP        2012-198415       10/2012

* cited by examiner

*Primary Examiner* — William R Alexander
(74) *Attorney, Agent, or Firm* — IPUSA, PLLC

(57) ABSTRACT

A scan driving device includes a waveform generator that generates a sawtooth driving waveform having a rise period in which a signal level rises, and a fall period in which the signal level falls, and a driving circuit that drives an optical scanning device, that resonates at a natural resonant frequency thereof, by a sawtooth driving voltage waveform corresponding to the sawtooth driving waveform. A time width of one of the rise period and the fall period is shorter than the other of the rise period and the fall period, and is an integer multiple of an inverse number of the natural resonant frequency.

8 Claims, 7 Drawing Sheets

SCAN DRIVING DEVICE, OPTICAL SCAN CONTROL APPARATUS, AND DRIVING WAVEFORM GENERATION METHOD

CROSS-REFERENCE TO RELATED APPLICATIONS

This application is based on and claims priority to Japanese Patent Application No. 2018-080207 filed on Apr. 18, 2018, the entire contents of which are incorporated herein by reference.

BACKGROUND OF THE INVENTION

1. Field of the Invention

The present invention relates to a scan driving device, an optical scan control apparatus, and a driving waveform generation method.

2. Description of the Related Art

An example of a conventional optical scanning device includes a mirror part that is rotated around a rotation axis to deflect light and perform an optical scan to form an image, for example. In such an optical scanning device, a driving source uses a voltage having sawtooth waveform.

An example of an optical deflector driving device is proposed in Japanese Laid-Open Patent Publication No. 2012-198415, for example.

However, ringing may be generated due to resonant oscillation of the mirror part when the mirror part is driven. This ringing may cause deterioration of an image quality of the image that is formed by the scanning of the optical scanning device.

SUMMARY OF THE INVENTION

Embodiments of the present invention can provide a scan driving device, an optical scan control apparatus, and a driving waveform generation method that can reduce the ringing that is generated in an optical scanning device.

According to one aspect of embodiments of the present invention, a scan driving device includes a waveform generator configured to generate a sawtooth driving waveform having a rise period in which a signal level rises, and a fall period in which the signal level falls; and a driving circuit configured to drive an optical scanning device, that resonates at a natural resonant frequency thereof, by a sawtooth driving voltage waveform corresponding to the sawtooth driving waveform, wherein a time width of one of the rise period and the fall period is shorter than the other of the rise period and the fall period, and is an integer multiple of an inverse number of the natural resonant frequency.

According to another aspect of the embodiments of the present invention, an optical scan control apparatus includes a scan driving device described above; and the optical scanning device.

According to still another aspect of the embodiments of the present invention, a driving waveform generation method includes generating a sawtooth driving waveform that has a rise period in which a signal level rises, and a fall period in which the signal level falls, and drives an optical scanning device that resonates at a natural resonant frequency thereof, wherein a time width of one of the rise period and the fall period is shorter than the other of the rise period and the fall period, and is an integer multiple of an inverse number of the natural resonant frequency.

Other objects and further features of the present invention will be apparent from the following detailed description when read in conjunction with the accompanying drawings.

DESCRIPTION OF THE PREFERRED EMBODIMENTS

Figure 1:
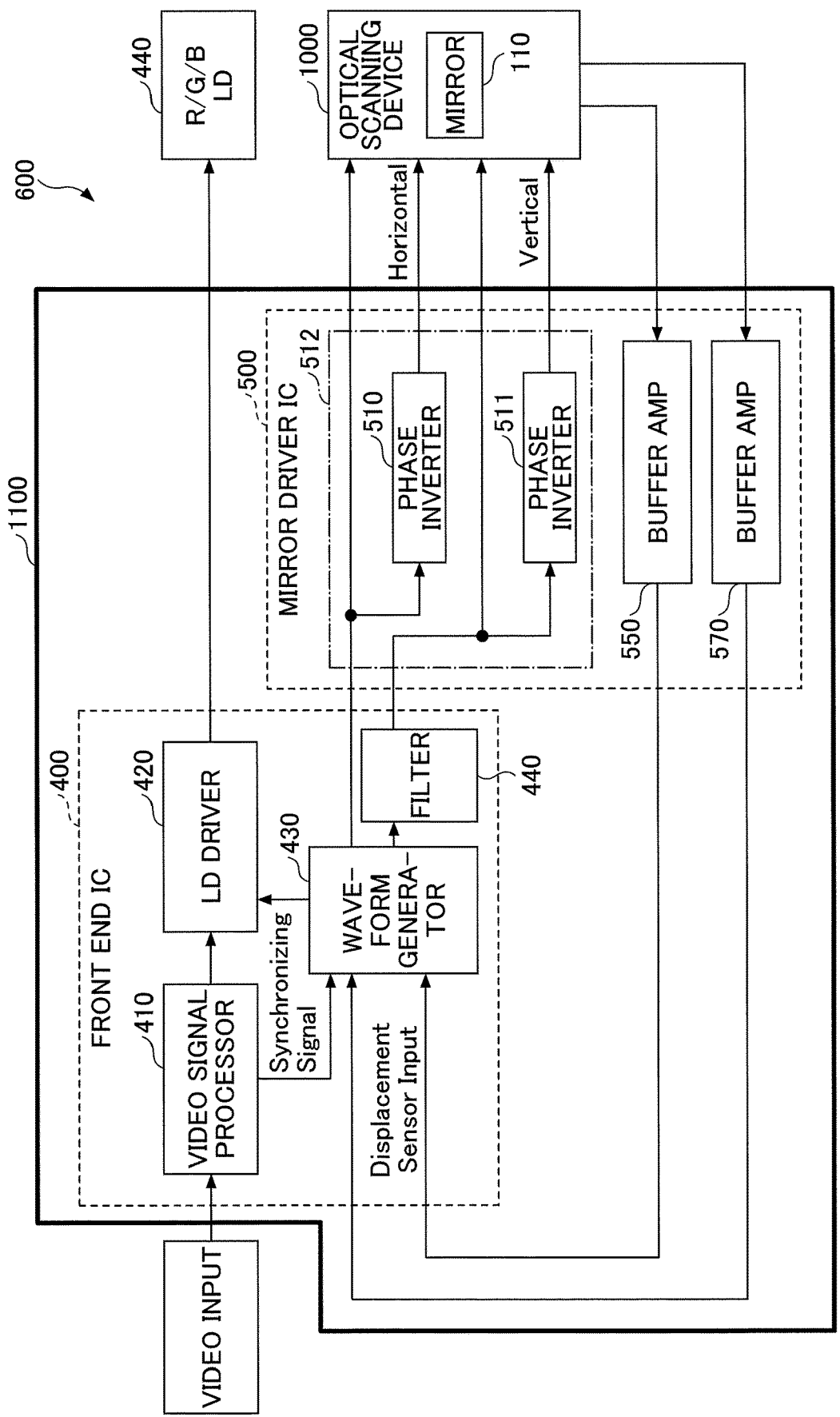
FIG. 1 is a block diagram illustrating an example of a structure of an optical scan control apparatus including a scan driving device in a first embodiment.

Embodiments of a scan driving device, an optical scan control apparatus, and a driving waveform generation method according to the present invention will be described, by referring to the drawings. In the drawings, those parts that are the same are designated by the same reference numerals, and a repeated description of the same parts may be omitted.

FIG. 1 is a block diagram illustrating an example of a structure of an optical scan control apparatus 600 including a scan driving device 1100 in a first embodiment. The optical scan control apparatus 600 includes the scan driving device 1100, and an optical scanning device 1000. The scan driving device 1100 drives the optical scanning device 1000 having a mirror 110, by a sawtooth (or triangular) driving voltage waveform. Details of the structure of the scan driving device 1100 will be described later in the specification.

Figure 2:
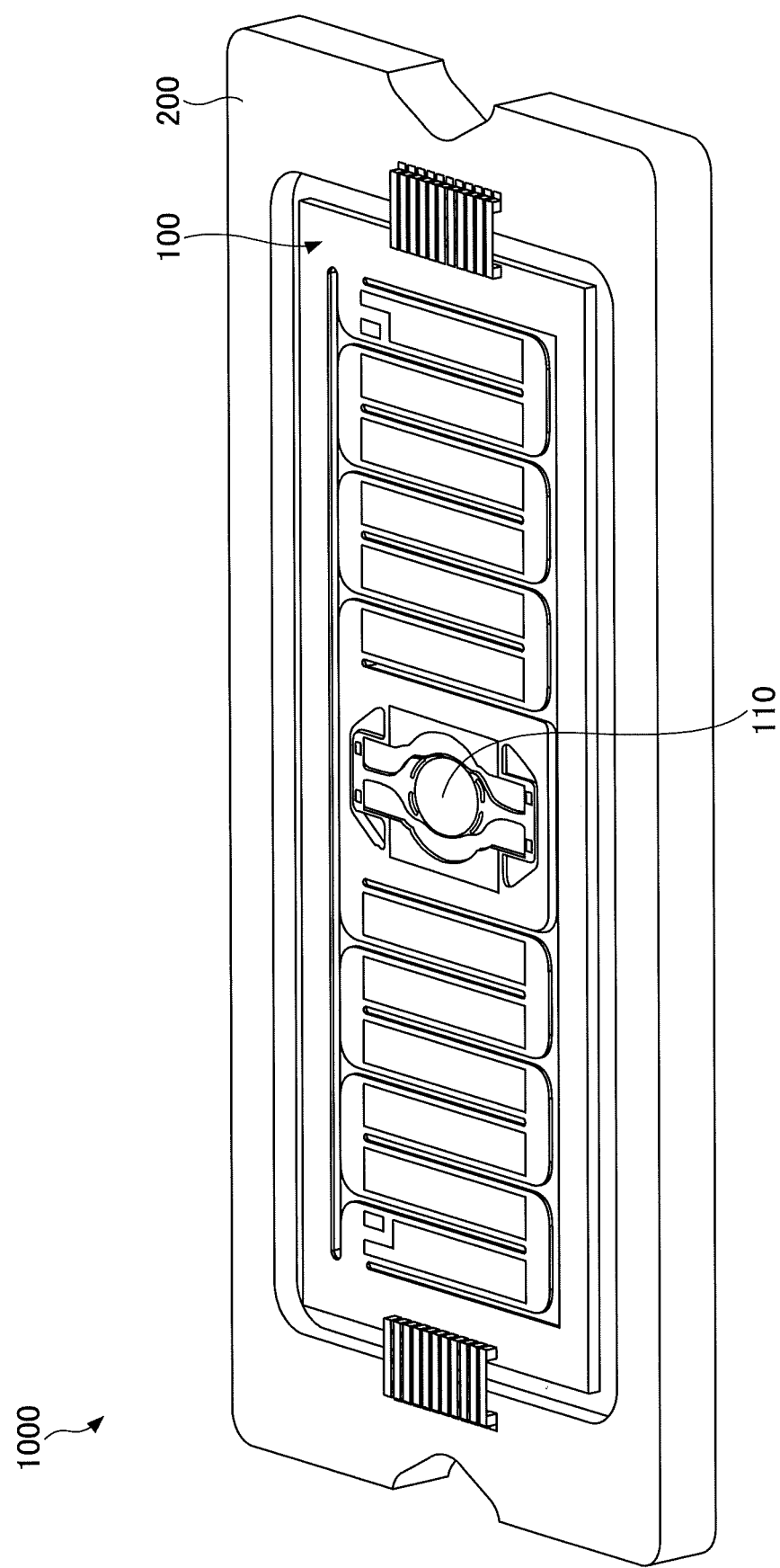
FIG. 2 is a perspective view illustrating an example of an optical scanning device in the first embodiment.
Figure 3:
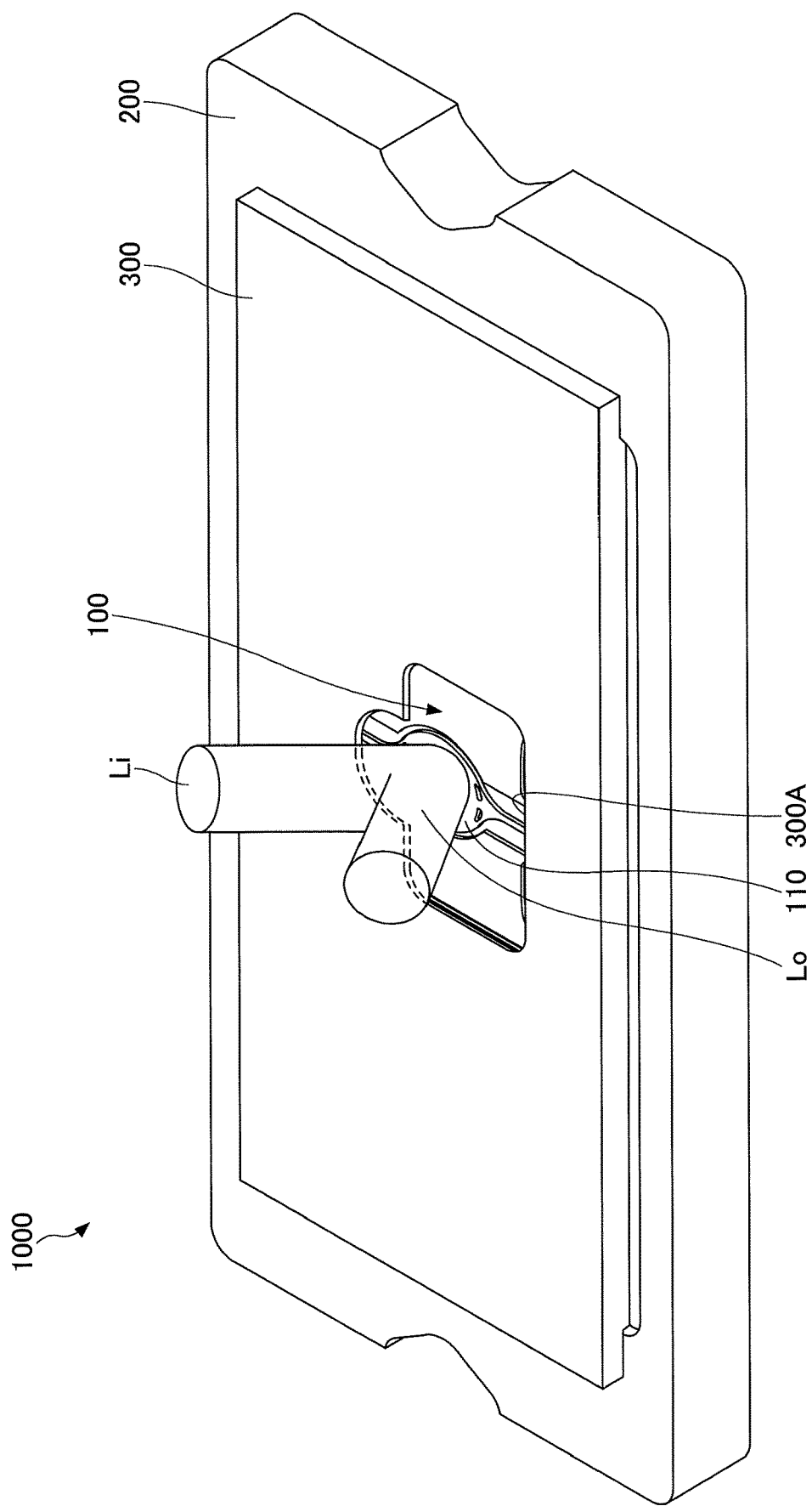
FIG. 3 is a perspective view illustrating the example of the optical scanning device in the first embodiment.

FIG. 2 and FIG. 3 are perspective views illustrating an example of the optical scanning device 1000 in the first embodiment. FIG. 2 illustrates the optical scanning device 1000 in a state in which a package cover is removed, and FIG. 3 illustrates the optical scanning device 1000 in a state in which the package cover is mounted thereon.

As illustrated in FIG. 2 and FIG. 3, the optical scanning device 1000 includes an optical scan part 100, a ceramic package 200 mounted with the optical scan part 100, and a package cover 300 that is arranged on the ceramic package 200 to cover the optical scan part 100. The optical scanning device 1000 may include a substrate, a control circuit, or the like provided underneath the ceramic package 200, on an opposite side from the optical scan part 100.

In the optical scanning device 1000, an opening 300A is provided at an approximate center part of the package cover 300, to expose a vicinity of a mirror 110 having a light reflection surface. The opening 300A has a shape that does not block or interfere with an incoming laser beam Li to the mirror 110 and an outgoing laser beam (or scanning light beam) Lo from the mirror 110.

A first side of the opening 300A where the incoming laser beam Li passes through is formed narrower than a second side of the opening 300A where the outgoing laser beam Lo passes through. In other words, the first side of the opening 300A where the incoming laser beam Li passes through has an approximate semi-circular shape that forms a narrow opening, while the second side of the opening 300A where the outgoing laser beam Lo passes through has an approximately rectangular shape that forms a wide opening. The incoming laser beam Li is incident to the mirror 110 from a predetermined direction, and for this reason, the opening 300A only needs to be open to pass through the incoming laser beam Li from the predetermined direction. On the other hand, because the outgoing laser beam Lo reflected from the mirror 110 performs a two-dimensional scan, the opening 300A needs to be open to pass through the outgoing laser beam Lo in the entire range of the two-dimensional scan.

Figure 4:
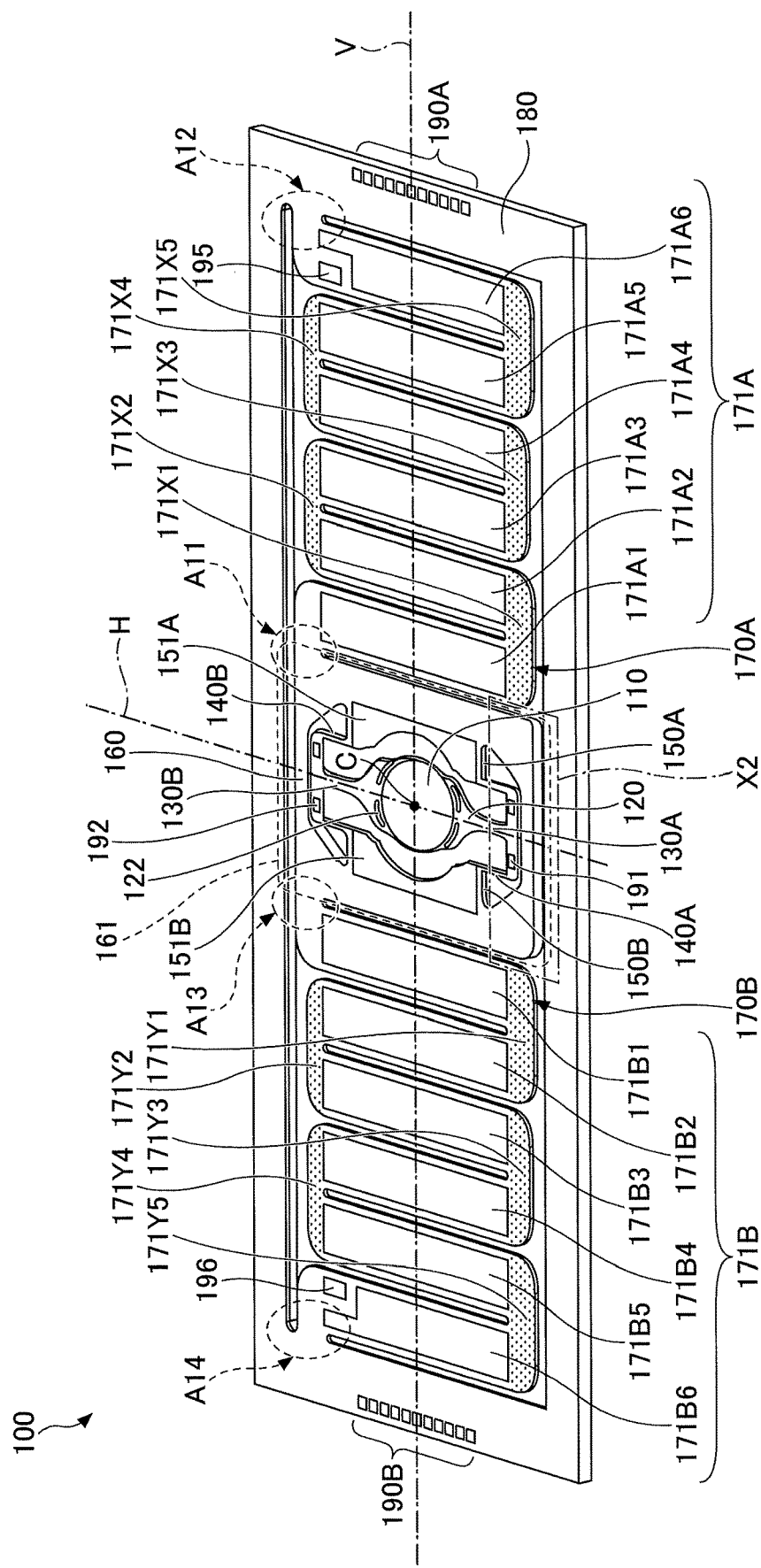
FIG. 4 is a perspective view, viewed from a top, illustrating an example of an optical scan part of the optical scanning device in the first embodiment.

Next, the optical scan part 100 of the optical scanning device 1000 will be described. FIG. 4 is a perspective view, viewed from a top, illustrating an example of the optical scan part 100 of the optical scanning device 1000 in the first embodiment.

As illustrated in FIG. 4, the optical scan part 100 oscillates the mirror 110 to cause the incoming laser beam emitted from a light source to perform the scan. The mirror 110 may be a Micro Electro Mechanical Systems (MEMS) mirror or the like, driven and oscillated by a piezoelectric element, for example.

The optical scan part 100 includes the mirror 110, a mirror support 120, torsion beams 130A and 130B, connection beams 140A and 140B, horizontal driving beams 150A and 150B, a movable frame 160, vertical driving beams 170A and 170B, and a fixed frame 180. The mirror 110 is supported on an upper surface of the mirror support 120. In this embodiment, a combination of the mirror support 120, the torsion beams 130A and 130B, the connection beams 140A and 140B, the horizontal driving beams 150A and 150B, and the movable frame 160 may be referred to as a mirror support body 161 that supports the mirror 110.

The pair of vertical driving beams 170A and 170B, that connect to the mirror support body 161, is arranged on both sides of the mirror support body 161. The mirror support body 161 and the vertical driving beam 170A are connected via a mirror support body connecting part A11. The fixed frame 180 and the vertical driving beam 170A are connected via a fixed frame connecting part A12. The mirror support body 161 and the vertical driving beam 170B are connected via a mirror support body connecting part A13. The fixed frame 180 and the vertical driving beam 170B are connected via a fixed frame connecting part A14. Details of the vertical driving beams 170A and 170B will be described later in the specification.

In addition, the pair of horizontal driving beams 150A and 150B, that connect to the mirror support 120, are arranged on both sides of the mirror support 120 that supports the mirror 110. The horizontal driving beams 150A and 150B, the connection beams 140A and 140B, the torsion beams 130A and 130B, the mirror support 120, and the mirror 110 are supported from the outside by the movable frame 160. In other words, one end of each of the horizontal driving beams 150A and 150B is connected to an inner periphery of the movable frame 160 and supported thereby. The other end of the horizontal driving beam 150A extends towards an inner peripheral side and connects to the connection beams 140A and 140B. The other end of the horizontal driving beam 150B similarly extends towards the inner peripheral side and connects to the connection beams 140A and 140B. The connection beams 140A and 140B are connected to the torsion beams 130A and 130B that extend in a direction of a horizontal rotation axis H, and the torsion beams 130A and 130B supports the mirror support 120 from both sides along the direction of the horizontal rotation axis H. As described above, the horizontal driving beams 150A and 150B are provided to form a pair sandwiching the mirror 110 and the mirror support 120, along a direction perpendicular to the direction of the horizontal rotation axis H in which the torsion beams 130A and 130B extend. The direction of the horizontal rotation axis H will be described later in the specification.

The horizontal driving beams 150A and 150B include horizontal driving sources 151A and 151B, respectively. In addition, the vertical driving beams 170A and 170B include vertical driving sources 171A and 171B, respectively. The horizontal driving beams 150A and 150B and the vertical driving beams 170A and 170B oscillate in up and down directions and in right and left direction, to function as an actuator that causes the laser beam to scan.

The horizontal driving sources 151A and 151B are formed on upper surfaces of the horizontal driving beams 150A and 150B, respectively. The horizontal driving source 151A includes an upper electrode formed on a thin film of a piezoelectric element (hereinafter also referred to as a "piezoelectric thin film") on the upper surface of the horizontal driving beam 150A, and a lower electrode formed on a lower surface of this piezoelectric thin film. The horizontal driving source 151B includes an upper electrode formed on a piezoelectric thin film on the upper surface of the horizontal driving beam 150B, and a lower electrode formed on a lower surface of this piezoelectric thin film. Each of the horizontal driving sources 151A and 151B expands and contracts according to a polarity of a driving voltage applied across the upper electrode and the lower electrode thereof.

For this reason, when driving voltages having waveforms (for example, sine waves) having mutually inverted phases are applied to the horizontal driving source 151A and the horizontal driving source 151B, the horizontal driving beam 150A and the horizontal driving beam 150B oscillate in mutually opposite, up and down directions, on both the left side and the right side of the mirror 110. Hence, the mirror 110 can be oscillated around the horizontal rotation axis H, using the torsion beams 130A and 130B as an oscillation axis or a rotation axis. A direction in which the mirror 110 oscillates around axes of the torsion beams 130A and 130B will be referred to as a horizontal direction, and the above described oscillation axis passing through a center C of a light reflection surface of the mirror 110 will be referred to as the horizontal rotation axis H. For example, resonant oscillation may be used for the horizontal drive by the horizontal driving beams 150A and 150B, and the mirror 110 can be driven and oscillated at a high speed.

A slit 122 is formed in the mirror support 120 along a circumference of the mirror 110. The slit 122 can reduce the weight of the mirror support 120, and at the same time, can transmit torsions of the torsion beams 130A and 130B to the mirror 110.

In addition, the vertical driving beam 170A includes a plurality of rectangular vertical beams extending along the direction of the horizontal rotation axis H. End parts of adjacent vertical beams are connected, to form a zigzag (cornice) shape as a whole.

For example, when counted from the side of the mirror support body 161, the end part of the first vertical beam and the end part of the second vertical beam are connected via a folded part 171X1. In addition, the end part of the second vertical beam and the end part of the third vertical beam are connected via a folded part 171X2. The end part of the third vertical beam and the fourth vertical beam are connected via a folded part 171X3. Further, the end part of the fourth vertical beam and the end part of the fifth vertical beam are connected via a folded part 171X4. The end part of the fifth vertical beam and the end part of the sixth vertical beam are connected via a folded part 171X5. In FIG. 4, each folded part of the vertical driving beam 170A is illustrated by a dot pattern for the sake of convenience.

Similarly, the vertical driving beam 170B includes a plurality of rectangular vertical beams extending along the direction of the horizontal rotation axis H. End parts of adjacent vertical beams are connected, to form a zigzag (cornice) shape as a whole.

For example, when counted from the side of the mirror support body 161, the end part of the first vertical beam and the end part of the second vertical beam are connected via a folded part 171Y1. In addition, the end part of the second vertical beam and the end part of the third vertical beam are connected via a folded part 171Y2. The end part of the third vertical beam and the fourth vertical beam are connected via a folded part 171Y3. Further, the end part of the fourth vertical beam and the end part of the fifth vertical beam are connected via a folded part 171Y4. The end part of the fifth vertical beam and the end part of the sixth vertical beam are connected via a folded part 171Y5. In FIG. 4, each folded part of the vertical driving beam 170B is illustrated by a dot pattern for the sake of convenience.

The vertical driving source 171A is formed on the upper surface of the vertical driving beam 170A, for each vertical beam that is a rectangular unit including no curved part. The vertical driving source 171A includes six vertical driving sources 171A1, 171A2, 171A3, 171A4, 171A5, and 171A6 that are respectively formed on the first through sixth vertical beams forming the vertical driving beam 170A. The vertical driving source 171B is formed on the upper surface of the vertical driving beam 170B, for each vertical beam that is a rectangular unit including no curved part. The vertical driving source 171B includes six vertical driving sources 171B1, 171B2, 171B3, 171B4, 171B5, and 171B6 that are respectively formed on the first through sixth vertical beams forming the vertical driving beam 170B. The vertical driving source 171A includes an upper electrode formed on a piezoelectric thin film on the upper surface of the vertical driving beam 170A, and a lower electrode formed on a lower surface of this piezoelectric thin film. The vertical driving source 171B includes an upper electrode formed on a piezoelectric thin film on the upper surface of the vertical driving beam 170B, and a lower electrode formed on a lower surface of this piezoelectric thin film.

The vertical driving beam 170A applies driving voltages having waveforms that are mutually inverted in up and down directions with reference to a center value of the driving waveform, to the adjacent vertical driving sources 171A for each of the vertical beams, to vary an amount of deformation of each vertical beam in the up direction, and transmit an accumulation of up and down movements of each vertical beam to the movable frame 160. At the same time, the vertical driving beam 170B applies driving voltages having waveforms that are mutually inverted in the up and down directions with reference to the center value of the driving waveform, to the adjacent vertical driving sources 171B for each of the vertical beams, to vary an amount of deformation of each vertical beam in the up direction, and transmit an accumulation of up and down movements of each vertical beam to the movable frame 160. The driving voltages having the waveforms that are mutually inverted in the up and down directions with reference to the center value of the driving waveform may be a sawtooth driving voltage waveform, for example. By such operations of the vertical driving beams 170A and 170B, the mirror 110 and the mirror support body 161 are oscillated in the direction perpendicular to the direction of the horizontal rotation axis H, and this oscillation direction will be referred to as a vertical direction. In addition, the above described oscillation axis passing through the center C of the light reflection surface of the mirror 110 will be referred to as a vertical rotation axis V. For example, nonresonant oscillation may be used for the vertical drive by the vertical driving beams 170A and 170B.

For example, the vertical driving sources 171A1, 171B1, 171A3, 171B3, 171A5, and 171B5 are driven by the same first waveform. On the other hand, the vertical driving sources 171A2, 171B2, 171A4, 171B4, 171A6, and 171B6 are driven by a second waveform that is inverted with respect to the first waveform in the up and down directions with reference to the center value of the driving waveform. Hence, the mirror 110 and the mirror support body 161 can be oscillated in the vertical direction.

Driving wirings that apply the driving voltage to the upper electrode and the lower electrode of the horizontal driving source 151A are connected to predetermined terminals included in a terminal group 190 that is provided on the fixed frame 180. Driving wirings that apply the driving voltage to the upper electrode and the lower electrode of the horizontal driving source 151B are connected to predetermined terminals included in a terminal group 190B that is provided on the fixed frame 180. In addition, driving wirings that apply the driving voltage to the upper electrode and the lower electrode of the vertical driving source 171A are connected to predetermined terminals included in the terminal group 190A that is provided on the fixed frame 180. Driving wirings that apply the driving voltage to the upper electrode and the lower electrode of the vertical driving source 171B are connected to predetermined terminals included in the terminal group 190B that is provided on the fixed frame 180.

In addition, the optical scan part 100 includes piezoelectric sensors 191 and 192, as horizontal oscillation angle sensors that detect an inclination of the mirror 110 in the horizontal direction (that is, an oscillation angle in the horizontal direction) in a state in which the driving voltages are applied to the horizontal driving sources 151A and 151B and the mirror 110 oscillates in the horizontal direction. The piezoelectric sensor 191 is provided on the connection beam 140A, and the piezoelectric sensor 192 is provided on the connection beam 140B.

Further, the optical scan part 100 includes piezoelectric sensors 195 and 196, as vertical oscillation angle sensors that detect an inclination of the mirror 110 in the vertical direction (that is, an oscillation angle in the vertical direction) in a state in which the driving voltages are applied to the vertical driving sources 171A and 171B and the mirror 110 oscillates in the vertical direction. The piezoelectric sensor 195 is provided on one of the vertical beams forming the vertical diving beam 170A, and the piezoelectric sensor 196 is provided on one of the vertical beams forming the vertical driving beam 170B.

The piezoelectric sensor 191 outputs a current value corresponding to a displacement of the connection beam 140A transmitted from the torsion beam 130A, according to the inclination of the mirror 110 in the horizontal direction. The piezoelectric sensor 192 outputs a current value corresponding to a displacement of the connection beam 140B transmitted from the torsion beam 130B, according to the inclination of the mirror 110 in the horizontal direction. The piezoelectric sensor 195 outputs a current value corresponding to a displacement of the vertical beam of the vertical driving beam 170A, on which the piezoelectric sensor 195 is provided, according to the inclination of mirror 110 in the vertical direction. The piezoelectric sensor 196 outputs a current value corresponding to a displacement of the vertical beam of the vertical driving beam 170B, on which the piezoelectric sensor 196 is provided, according to the inclination of the mirror 110 in the vertical direction.

In the first embodiment, the inclination of the mirror 110 in the horizontal direction is detected using outputs of the piezoelectric sensors 191 and 192, and the inclination of the mirror 110 in the vertical direction is detected using outputs of the piezoelectric sensors 195 and 196. An inclination detector, that detects the inclination of the mirror 110 from the current values output from the piezoelectric sensors 191, 192, 195, and 196, may be provided externally to the optical scan part 100. In addition, a drive controller, that controls the driving voltages supplied to the horizontal driving sources 151A and 151B and the vertical driving sources 171A and 171B based on a detection result of the inclination detector, may be provided externally to the optical scan part 100.

Each of the piezoelectric sensors 191, 192, 195, and 196 includes a piezoelectric thin film, an upper electrode formed on the piezoelectric thin film, and a lower electrode formed on a lower surface of the piezoelectric thin film. In the first embodiment, the output of each piezoelectric sensor has a current value of a sensor wiring connected to the upper electrode and the lower electrode thereof.

The sensor wirings drawn out from the upper electrode and the lower electrode of the piezoelectric sensor 191 are connected to predetermined terminals included in the terminal group 190B that is provided on the fixed frame 180. The sensor wirings drawn out from the upper electrode and the lower electrode of the piezoelectric sensor 195 are connected to predetermined terminals included in the terminal group 190A that is provided on the fixed frame 180. In addition, the sensor wirings drawn out from the upper electrode and the lower electrode of the piezoelectric sensor 192 are connected to predetermined terminals included in the terminal group 190B that is provided on the fixed frame 180. The sensor wirings drawn out from the upper electrode and the lower electrode of the piezoelectric sensor 196 are connected to predetermined terminals included in the terminal group 190B that is provided on the fixed frame 180.

The optical scan part 100 may be formed using a Silicon On Insulator (SOI) substrate including a support layer, a Buried Oxide (BOX) layer, and an active layer, for example. For example, the movable frame 160, ribs provided on back surfaces of the horizontal driving beams 150A and 150B, ribs provided on back surfaces of the vertical driving beams 170A and 170B, or the like are members formed by patterning the support layer. In addition, the horizontal driving beams 150A and 150B, the vertical driving beams 170A and 170B, or the like are members formed by patterning the active layer and the BOX layer, or formed by patterning the active layer.

Next, the details of the structure of the scan driving device 1100 will be described, by referring to FIG. 1. The scan driving device 1100 includes a front end Integrated Circuit (IC) 400, a Laser Diode (LD) 540, and a mirror driver IC 500.

The front end IC 400 in this embodiment performs a signal processing on an input video signal, and supplies a processed signal to the LD 540. In addition, the front end IC 400 in this embodiment supplies to the mirror driver IC 500 a signal that controls the oscillation of the mirror 110.

The front end IC 400 in this embodiment includes a video signal processor 410, a LD driver 420, and a waveform generator 430. The video signal processor 410 performs a process to separate a synchronizing signal included in the input video signal, from a luminance signal and a chromaticity signal included in the input video signal. The video signal processor 410 supplies the luminance signal and the chromaticity signal to the LD driver 420, and supplies the synchronizing signal to the waveform generator 430.

The LD driver 420 controls the LD 540 based on the signals output from the video signal processor 410.

The waveform generator 430 generates a driving waveform (or driving waveform signal) that controls the oscillation of the mirror 110, based on the outputs of the piezoelectric sensors 191, 192, 195, and 196 that are received via the mirror driver IC 500 and the synchronizing signal output from the video signal processor 410. The waveform generator 430 generates the driving waveform signal having a sine waveform that oscillates the mirror 110 in the horizontal direction around the horizontal rotation axis H, and the driving waveform signal having a sawtooth waveform that oscillates the mirror 110 in the vertical direction around the vertical rotation axis V.

The mirror driver IC 500 drives the optical scanning device 1000 by the driving voltage waveform corresponding to the driving waveform (driving waveform signal) generated by the waveform generator 430. The mirror driver IC 500 in this embodiment includes buffer amplifiers 550 and 570, and a driving part 512.

The buffer amplifier 550 amplifies the outputs of the piezoelectric sensors 191 and 192 that detect the inclination of the mirror 110 in the horizontal direction (that is, the oscillation angle in the horizontal direction), and to output the amplified outputs to the waveform generator 430. The buffer amplifier 570 amplifies the outputs of the piezoelectric sensors 195 and 196 that detect the inclination of the mirror 110 in the vertical direction (that is, the oscillation angle in the vertical direction), and to output the amplified outputs to the waveform generator 430.

The driving part 512 drives the optical scanning device 1000 by the driving voltage waveform corresponding to the driving waveform (that is, driving waveform signal) generated by the waveform generator 430. The driving part 512 is a circuit that amplifies the sine waveform and the sawtooth waveform generated by the waveform generator 430, for example, and drives the optical scanning device 1000 by the driving voltage waveform having the amplified sine waveform and the amplifier sawtooth waveform.

The driving part 512 includes phase inverters 510 and 511. The phase inverters 510 and 511 invert the phase of the driving waveform signal output from the waveform generator 430. More particularly, the phase inverter 510 inverts the phase of the sine driving voltage waveform that is applied to the horizontal driving source 151A from the driving part 512, and applies the sine driving voltage waveform having the inverted phase to the horizontal driving source 151B. Hence, the mirror 110 can be oscillated around the horizontal rotation axis H, using the torsion beams 130A and 130B as the oscillation axis or the rotation axis.

On the other hand, the driving part 512 applies sawtooth driving voltage waveforms having the same phase to each of the vertical driving sources 171A1, 171B1, 171A3, 171B3, 171A5, and 171B5 that are arranged at odd numbered positions counted from the side of the movable frame 160. At the same time, the phase inverter 511 applies sawtooth driving voltage waveforms having the same phase to each of the vertical driving sources 171A2, 171B2, 171A4, 171B4, 171A6, and 171B6 that are arranged at even numbered positions counted from the side of the movable frame 160. In this state, the phase inverter 511 applies to each of the vertical driving sources 171A2 or the like arranged at the even numbered positions the sawtooth driving voltage waveform having a phase that is inverted with respect to the phase of the sawtooth voltage waveform applied to each of the vertical driving sources 171A1 or the like arranged at the odd numbered positions. Hence, the mirror 110 can be oscillated around the vertical rotation axis V.

Figure 5:
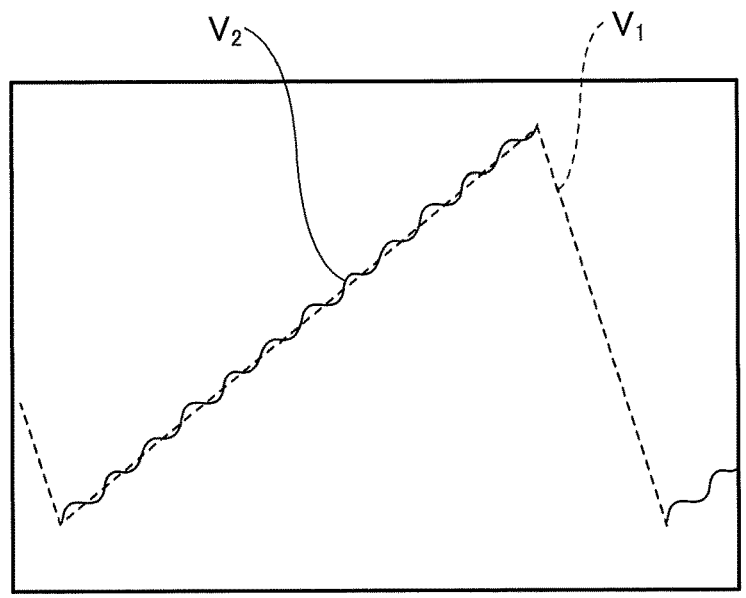
FIG. 5 is a diagram for explaining a relationship between a driving voltage waveform applied to a driving source, and an operation waveform of a mirror.
Figure 6:
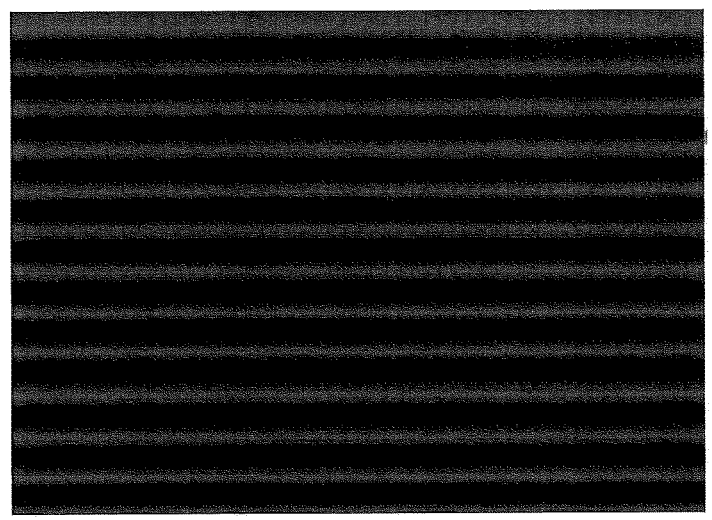
FIG. 6 is a diagram illustrating an image that is displayed using the optical scanning device.

Next, an operation of the optical scanning device 1000 will be described. FIG. 5 is a diagram for explaining a relationship between the driving voltage waveform applied to the vertical driving sources 171A and 171B, and an operation waveform of the mirror 110. In FIG. 5, a dotted line indicates a driving voltage waveform $V_1$, and a solid line indicates a mirror operation waveform $V_2$. FIG. 6 is a diagram illustrating an image that is displayed using the optical scanning device 1000.

As illustrated in FIG. 5, for example, the voltage having the sawtooth waveform is applied to the vertical driving sources 171A and 171B. Hence, compared to a case in which a voltage having a sine waveform, for example, is applied to the vertical driving sources 171A and 171B, it is possible to increase a section (linear region S in FIG. 9) in which an optical scan velocity of the mirror 110 becomes constant.

When the mirror 110 is driven using the driving voltage waveform $V_1$ illustrated in FIG. 5 as the sawtooth waveform to be applied to the vertical driving, sources 171A and 171B, the mirror operation waveform $V_2$ of the mirror 110 may oscillate, to generate the so-called ringing. When the optical scanning device 1000 is used to display an image in a state where the is generated, horizontal stripes are generated as illustrated in FIG. 6, for example, and an image quality deteriorates.

Accordingly, the waveform generator 430 in this embodiment generates a sawtooth driving waveform that can inhibit generation of the ringing.

Figure 7:
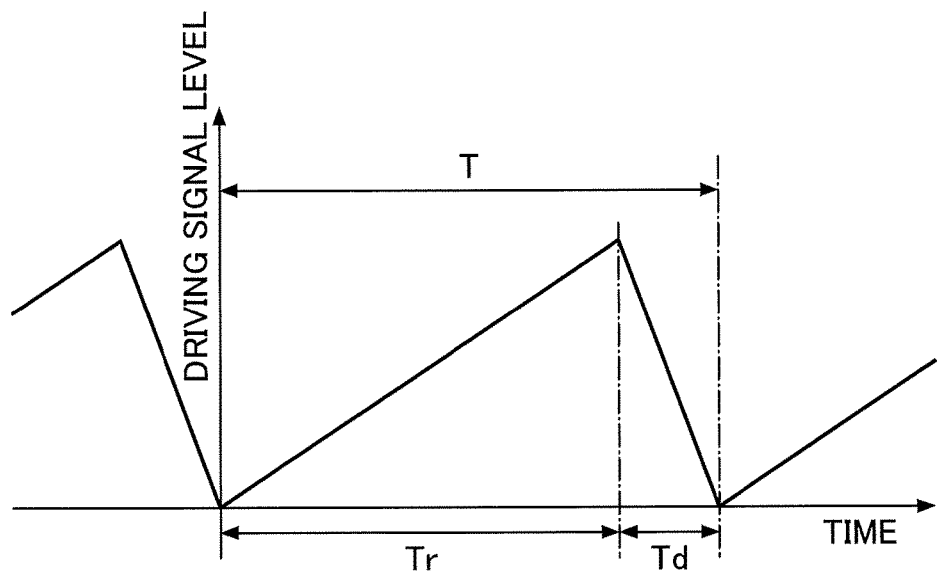
FIG. 7 is a diagram illustrating an example of a sawtooth driving waveform generated by a waveform generator.

FIG. 7 is a diagram illustrating an example of the sawtooth driving waveform generated by the waveform generator 430. The sawtooth driving waveform generated by the waveform generator 430 has a rise period Tr in which a signal level rises, and a fall period Td in which the signal level falls. The rise period Tr indicates a period in which the signal level linearly increases from a minimum value to a maximum value of an amplitude of the driving waveform. The fall period Td indicates a period in which the signal level linearly decreases from the maximum value to the minimum value of the amplitude of the driving waveform. The waveform generator 430 generates the sawtooth driving waveform so that a time width (or length) of one of the rise period Tr and the fall period Td becomes shorter than the other of the rise period Tr and the fall period Td. FIG. 7 illustrates an example in which the time width of the fall period Td is shorter than the time width of the rise period Tr.

Figure 8:
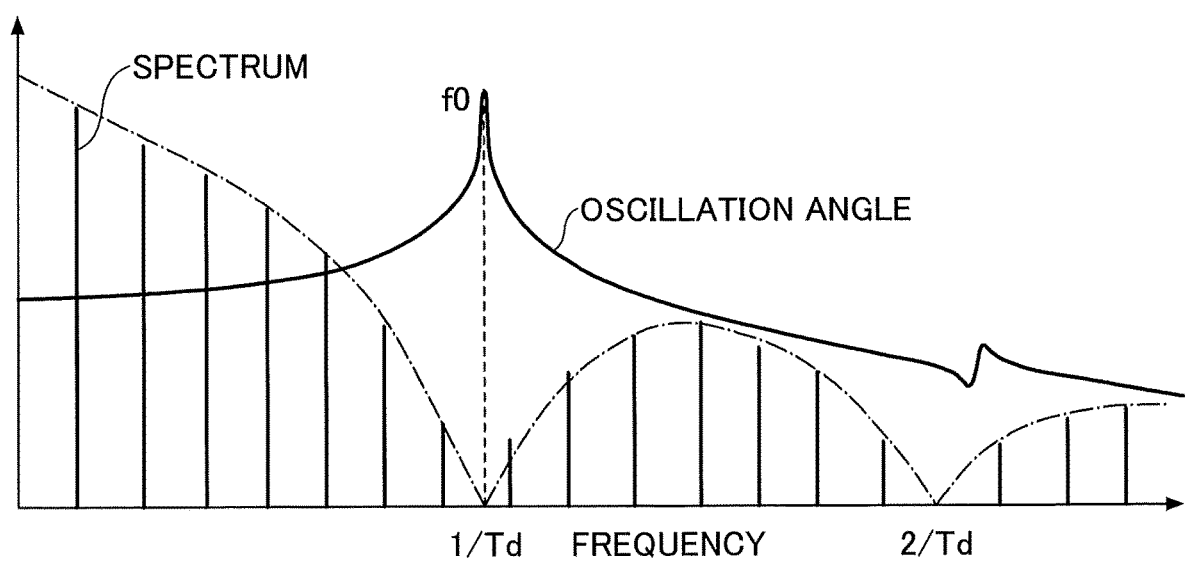
FIG. 8 is a diagram illustrating an example of a relationship between a spectrum of the sawtooth driving waveform, and a natural resonant frequency of the optical scanning device itself.

FIG. 8 is a diagram illustrating an example of a relationship between a spectrum of the sawtooth driving waveform, and a natural resonant frequency f0 of the optical scanning device 1000 itself. The natural resonant frequency f0 is a natural frequency related to the oscillation around the vertical rotation axis V of the optical scanning device 1000. When the sawtooth driving waveform is analyzed using Fast Fourier Transform (FFT), the spectrum of the sawtooth driving waveform repeatedly generates frequency points where a frequency component periodically becomes zero on the frequency axis. The frequency (or frequency step) of these frequency points approximately matches the frequency having a period amounting to a length of the shorter one of the time widths of the rise period Tr and the fall period Td (that is, the length of the time width of the fall period Td in the example illustrated in FIG. 7).

Accordingly, when causing the mirror 110 of the optical scanning device 1000 that resonates at the natural resonant frequency f0 to scan with the sawtooth waveform, the resonant frequency component is no longer included in the sawtooth driving waveform if the frequency point where the frequency component becomes zero matches the natural resonant frequency f0 as illustrated in FIG. 8. Hence, unwanted resonance is not excited in the oscillation angle toward the vertical side of the mirror 110, the ringing is reduced, and the optical scan velocity can be maintained constant with a high accuracy. In other words, the scan accuracy is improved, and the image quality of the image that is displayed using the optical scanning device 1000 is improved.

In addition, the waveform generator 430 generates the sawtooth driving waveform so that a frequency of a harmonic component matching an integer multiple of a frequency fv of the sawtooth driving waveform is different from the natural resonant frequency. Consequently, the unwanted resonance is not excited in the oscillation angle toward the vertical side of the mirror 110, the ringing is reduced, and the optical scan velocity can be maintained constant with a high accuracy. In other words, the scan accuracy is improved, and the image quality of the image that is displayed using the optical scanning device 1000 is improved.

Hence, the waveform generator 430 in this embodiment selects, as the driving frequency (inverse number of a driving period T) fv at which the optical scanning device 1000 is driven, a frequency that is closest to a desired refresh rate (or frame rate) among frequencies satisfying the following formula, where fv denotes the frequency of the sawtooth driving waveform, f0 denotes the natural frequency (resonant frequency) related to the oscillation around the vertical rotation axis V of the optical scanning device 1000, and n denotes an integer.

$$Fv = f0/(½+n)$$

The refresh rate indicates a frequency of the scan. By computing the frequency fv by dividing the natural resonant frequency f0 by a sum of n and ½, and not simply dividing the natural resonant frequency f0 by n, it is possible to select the frequency fv that is separated as much as possible, frequency-wise, from the natural resonant frequency f0.

The waveform generator 430 in this embodiment selects the time width of the fall period Td from time widths (integer multiples of the inverse number of the natural resonant frequency f0) satisfying the following formula, where m denotes an integer.

$$Td = m/f0$$

The waveform generator 430 can determine the rise time Tr y subtracting the time width of the fall time Td from the driving period T, that is, from the following formula.

$$Tr = T - Td$$

Figure 9:
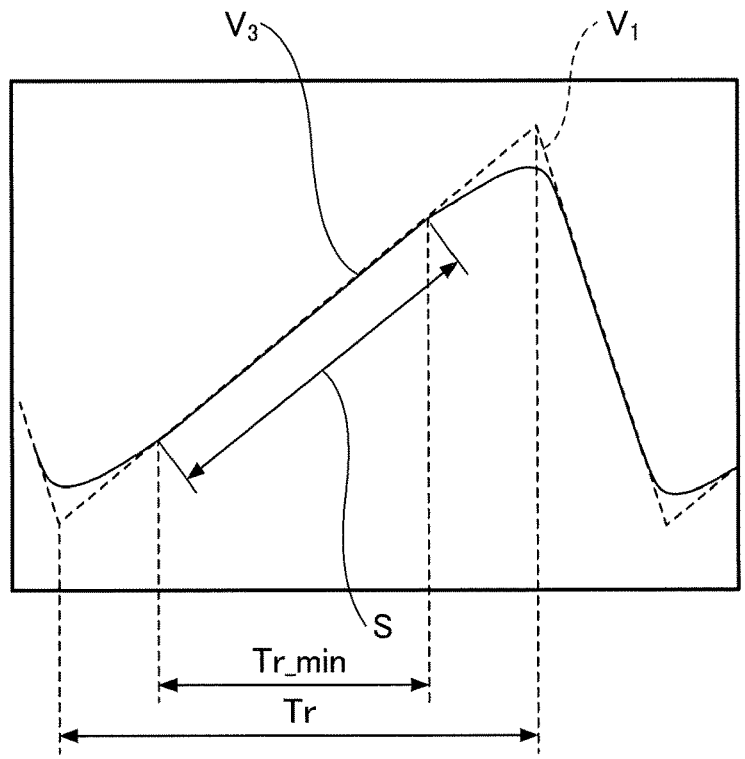
FIG. 9 is a diagram for explaining waveform corruption of the mirror operation waveform.

Accordingly, by driving the optical scanning device 1000 based on the sawtooth driving waveform having the frequency v and the fall period Td that are computed as described above, it is possible to reduce the ringing in a mirror operation waveform $V_3$, as illustrated in FIG. 9. FIG. 9 is a diagram for explaining waveform corruption of the mirror operation waveform. A frequency of the driving voltage waveform $V_1$ applied to the vertical driving sources 171A and 171B and the lengths of a fall period and a rise period may be approximately the same as the frequency fv of the driving waveform generated by the waveform generator 430 and the lengths of the fall period Td and the rise period Tr.

In addition, the natural resonant frequency of the optical scanning device 1000 is not necessarily a single frequency. For this reason, when the optical scanning device 1000 resonates at resonant frequencies f1, f2, . . . other than the natural resonant frequency f0, the scan accuracy may deteriorate.

Accordingly, as a countermeasure against possible scan accuracy deterioration, the scan driving device 1100 may include a filter circuit 440 for attenuating components of the resonant frequencies f1, f2, . . . so as to eliminate components of the resonant frequencies f1, f2, . . . other than the natural resonant frequency f0 from the sawtooth driving waveform. The filter circuit 440 may include a lowpass filter or a bandstop filter, to filter the sawtooth driving waveform generated by the waveform generator 430. The driving part 512 drives the optical scanning device 1000 by the sawtooth driving voltage waveform corresponding to the driving waveform that has been filtered by the filter circuit 440. The lowpass filter attenuates a frequency component higher than a cutoff frequency. The bandstop filter attenuates a frequency component included in a predetermined band.

Figure 10:
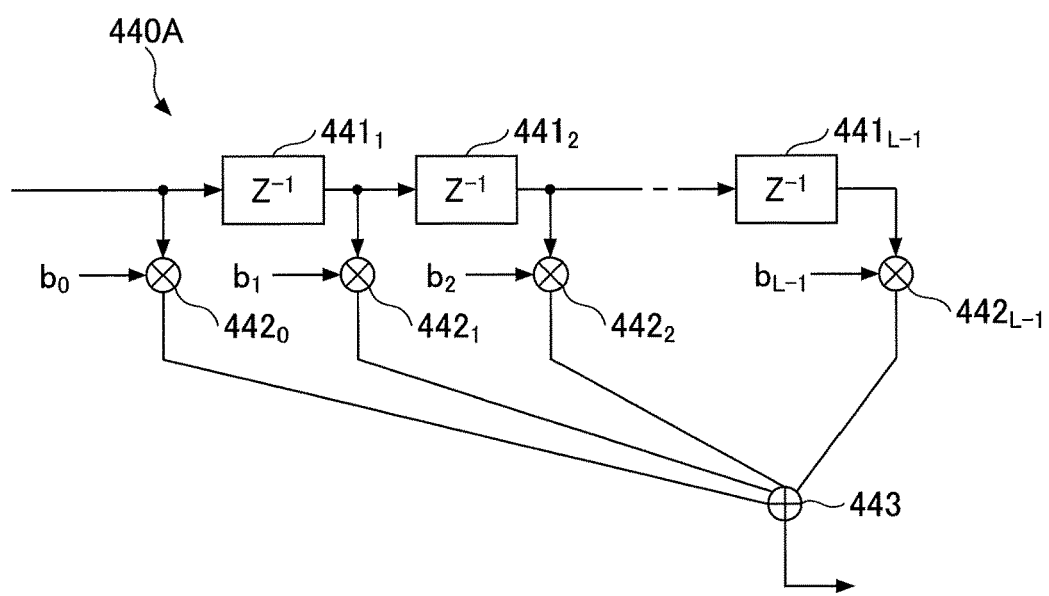
FIG. 10 is a diagram illustrating an example of a structure of a Finite Impulse Response (FIR) filter.

The filter circuit 440 is preferably a Finite Impulse Response (FIR) filter 440A illustrated in FIG. 10. FIG. 10 is a diagram illustrating an example of a structure of the FIR filter 440A. The FIR filter 440A has a known structure including L-1 delay blocks $441_1, \ldots, 441_{L-1}$, L multipliers $442_0, \ldots, 442_{L-1}$, and one adder 443.

Next, a method of designing filter constants that determine a filter characteristic of the FIR filter 440A will be described.

When a filtering process of the FIR filter 440A is performed, waveform corruption of the sawtooth driving voltage waveform $V_1$ may occur to corrupt the sawtooth driving voltage waveform $V_1$ into a waveform having deteriorated linearity, such as the mirror operation waveform $V_3$ indicated by the solid line in FIG. 9, for example. As a result, the linear region S that becomes a vertical imaging region (section in which the scan velocity of the optical scanning device 1000 is constant) may become short, to narrow the region usable for the image display. For this reason, it is required that the linear region S usable for the image display is secured, and at the same time, that the ringing is reduced.

Among the rise periods Tr of the sawtooth driving waveform, a minimum rise period Tr_min required to secure the linear region S may be represented by the following formula, where fh denotes the resonant frequency on the horizontal side, and k denotes a desired number of horizontal scanning lines.

$Tr\_min=1/(2\times fh)\times k$

The resonant frequency fh on the horizontal side refers to the natural frequency relates to the oscillation of the optical scanning device 1000 around the horizontal rotation axis H. The scan in the horizontal direction depends on the horizontal scan velocity. A term "$1/(2\times fh)$" represents the scan time per one horizontal scanning line. Accordingly, from the above described formula, it is possible to obtain how much the length (or time) rise period Tr (that is, Tr_min) may be reduced.

A period (that is, a maximum rise period dT_max) in which the waveform corruption caused by the filtering process is tolerated, may be represented by the following formula.

$dT\_max=Tr-Tr\_min$

Hence, a tap number L of the FIR filter 440A may be designed according to the following relationship, and a data rate Dr of the waveform data may be determined by the refresh rate (or frame rate) of the image scan.

$L \approx dT\_max/Dr$

In addition, filter coefficients $b_0, b_1, b_2, \ldots, b_{L-1}$ are selected so that zero points of the FIR filter 440A are arranged at the natural resonant frequency f0 on the vertical side and the resonant frequencies f0, f1, f2, . . . . By using the FIR filter 440A having the filter coefficients $b_0, b_1, b_2, \ldots, b_{L-1}$ that are set in this manner, it is possible to prevent deterioration of the scan accuracy.

The optical scanning device 1000 may be resonated in advance to measure the resonant frequencies f0, f1, f2, . . . and the resonant frequency fh on the horizontal side. In this case, the measured values may be set to the waveform generator 430 as parameters for generating the sawtooth driving waveform.

Further, variable factors of the resonant frequency, such as the temperature or the like, may be measured in advance, to cope with the variation of the resonant frequency of the optical scanning device 1000 caused by the temperature or the like. In this case, the waveform generator 430 may compute an estimated value of the current resonant frequency of the optical scanning device 1000 from the measured values of the variable factors, so as to adjust, every moment, the resonant frequency used to generate the sawtooth driving waveform.

The functions of the front end IC 400, such as the functions of the video signal processor 310, the LD driver 420, the waveform generator 430, and the filter circuit 440, may be executed by a processor that executes a program stored in a nontransitory computer-readable storage medium. Such a processor may be formed by a Central Processing Unit (CPU), for example.

According to each of the embodiments described above, it is possible to reduce the ringing that is generated in the optical scanning device.

The description above use terms such as "determine", or the like to describe the embodiments, however, such terms are abstractions of the actual operations that are performed. Hence, the actual operations that correspond to such terms may vary depending on the implementation, as is obvious to those skilled in the art.

Further, the present invention is not limited to these embodiments, but various variations, modifications, and substitutions of a part or all of the embodiments may be made without departing from the scope of the present invention.

For example, in the embodiments described above, The time width of the fall period Td is shorter than the time width of the rise period Tr, and thus, the fall period Td having the shorter time width is set to the time width that is an integer multiple of the inverse number of the natural resonant frequency f0. However, the time width of the rise period Tr may be shorter than the time width of the fall period Td. In this case, the rise period Tr having the shorter time width may be set to the time width that is an integer multiple of the inverse number of the natural resonant frequency f0.

Further, the embodiments described above compute the frequency fv of the sawtooth driving waveform by dividing the natural resonant frequency f0 by the sum of n and ½. However, the frequency fv may be computed by dividing the natural resonant frequency f0 by a sum of n and 1/q, where q denotes a value greater than 1. For example, q may be greater than 1 and less than or equal to 5.

What is claimed is:

1. A scan driving device comprising:
   a waveform generator configured to generate a sawtooth driving waveform having a rise period in which a signal level rises, and a fall period in which the signal level falls; and
   a driving circuit configured to drive an optical scanning device, that resonates at a natural resonant frequency thereof, by a sawtooth driving voltage waveform corresponding to the sawtooth driving waveform,
   wherein a time width of one of the rise period and the fall period is shorter than the other of the rise period and the fall period, and is an integer multiple of an inverse number of the natural resonant frequency.

2. The scan driving device as claimed in claim 1, wherein the one of the rise period and the fall period is the fall period.

3. The scan driving device as claimed in claim 1, further comprising:
   a filter circuit, including a lowpass filter or a bandstop filter, and configured to filter the sawtooth driving waveform,
   wherein the sawtooth driving voltage waveform corresponds to a driving waveform that is obtained after filtering the sawtooth driving waveform by the filter circuit.

4. The scan driving device as claimed in claim 3, wherein the filter circuit is a Finite Impulse Response (FIR) filter.

5. The scan driving device as claimed in claim 1, wherein an integer multiple of a frequency of the sawtooth driving waveform is different from the natural resonant frequency.

6. The scan driving device as claimed in claim 5, wherein a formula fv=f0/(½+n) stands, where fv denotes the frequency of the sawtooth driving waveform, f0 denotes the natural resonant frequency, and a is an integer.

7. An optical scan control apparatus comprising:
   a scan driving device according to claim 1; and
   the optical scanning device.

8. A driving waveform generation method comprising:
   generating a sawtooth driving waveform that has a rise period in which a signal level rises, and a fall period in which the signal level falls, and drives an optical scanning device that resonates at a natural resonant frequency thereof,
   wherein a time width of one of the rise period and the fall period is shorter than the other of the rise period and the fall period, and is an integer multiple of an inverse number of the natural resonant frequency.

* * * * *